(12) United States Patent
Nam

(10) Patent No.: US 9,905,540 B1
(45) Date of Patent: Feb. 27, 2018

(54) FAN-OUT PACKAGES INCLUDING VERTICALLY STACKED CHIPS AND METHODS OF FABRICATING THE SAME

(71) Applicant: SK hynix Inc., Icheon-si, Gyeonggi-do (KR)

(72) Inventor: Jong Hyun Nam, Seoul (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/428,846

(22) Filed: Feb. 9, 2017

(30) Foreign Application Priority Data

Aug. 22, 2016 (KR) .......................... 10-2016-0106124

(51) Int. Cl.
| | | |
|---|---|---|
| H01L 23/00 | (2006.01) | |
| H01L 23/31 | (2006.01) | |
| H01L 23/528 | (2006.01) | |
| H01L 25/065 | (2006.01) | |
| H01L 23/498 | (2006.01) | |
| H01L 23/522 | (2006.01) | |
| H01L 25/00 | (2006.01) | |

(52) U.S. Cl.
CPC .... *H01L 25/0657* (2013.01); *H01L 23/49816* (2013.01); *H01L 23/5226* (2013.01); *H01L 24/16* (2013.01); *H01L 25/50* (2013.01); *H01L 2224/16145* (2013.01)

(58) Field of Classification Search
CPC ....... H01L 2924/00; H01L 2224/32225; H01L 2924/00014; H01L 2224/16225; H01L 2224/32145; H01L 2224/12105; H01L 2224/04105; H01L 24/19; H01L 24/96; H01L 23/5389

USPC ... 438/107, 127, 113, 108, 109, 106, 15, 51; 257/777, 686
See application file for complete search history.

(56) References Cited

U.S. PATENT DOCUMENTS 6,492,726 B1 * 12/2002 Quek .................... H01L 23/055
257/723
2010/0193930 A1 * 8/2010 Lee ................... H01L 23/49816
257/686

(Continued)

FOREIGN PATENT DOCUMENTS

KR 20100136866 A 12/2010
KR 101607989 B1 3/2016

*Primary Examiner* — Jonathan Han
(74) *Attorney, Agent, or Firm* — William Park & Associates Ltd.

(57) ABSTRACT

A fan-out package may include a core supporter having a through hole, a first semiconductor chip disposed on a first surface of the core supporter in a way that a portion of the first semiconductor chip is exposed by the through hole, a second semiconductor chip disposed on a second surface of the core supporter, a first photosensitive dielectric layer disposed on the first surface of the core supporter to cover the first semiconductor chip, a second photosensitive dielectric layer disposed on the second surface of the core supporter to cover the second semiconductor chip and to fill the through hole, a first trace pattern disposed on the second photosensitive dielectric layer, and a first conductive via penetrating the second photosensitive dielectric layer in the through hole to be connected to both of the first trace pattern and the first semiconductor chip.

19 Claims, 9 Drawing Sheets

(56) References Cited

U.S. PATENT DOCUMENTS

| | | | |
|---|---|---|---|
| 2013/0015586 A1* | 1/2013 | Crisp | H01L 25/0655 |
| | | | 257/774 |
| 2013/0147063 A1* | 6/2013 | Park | H01L 21/568 |
| | | | 257/777 |
| 2015/0108661 A1* | 4/2015 | Vincent | H01L 24/30 |
| | | | 257/777 |
| 2015/0357307 A1* | 12/2015 | Fu | H01L 23/481 |
| | | | 257/774 |

* cited by examiner

FAN-OUT PACKAGES INCLUDING VERTICALLY STACKED CHIPS AND METHODS OF FABRICATING THE SAME

CROSS-REFERENCE TO RELATED APPLICATIONS

The present application claims priority under 35 U.S.C 119(a) to Korean Application number 10-2016-0106124 filed on Aug. 22, 2016, which is incorporated herein by references in its entirety.

BACKGROUND

1. Technical Field

Embodiments of the present disclosure generally relate to semiconductor packages, and, more particularly, to fan-out packages including vertically stacked chips and methods of fabricating the same.

2. Related Art

In a semiconductor package technology, fan-out wafer level packages (FOWLPs) are increasingly in demand with the development of smaller electronic systems or products. The FOWLP may be fabricated so that interconnection structures of a semiconductor chip extend onto a molding layer covering the semiconductor chip without use of an organic substrate (e.g., a printed circuit board) including interconnection structures. A wafer level package technology may be used in fabrication of the FOWLPs, and in using the wafer level package technology, it is important to minimize a warpage phenomenon and a chip shift phenomenon to improve the reliability of the FOWLPs.

SUMMARY

According to an embodiment, a fan-out package may include a core supporter, a first semiconductor chip, a second semiconductor chip, a first photosensitive dielectric layer, a second photosensitive dielectric layer, a first trace pattern, and a first conductive via. The core supporter may have a through hole. The first semiconductor chip may be disposed on a first surface of the core supporter in a way that a portion of the first semiconductor chip is exposed by the through hole. The second semiconductor chip may be disposed on a second surface of the core supporter. The first photosensitive dielectric layer may be disposed on the first surface of the core supporter to cover the first semiconductor chip. The second photosensitive dielectric layer may be disposed on the second surface of the core supporter to cover the second semiconductor chip and to fill the through hole. The first trace pattern may be disposed on the second photosensitive dielectric layer. The first conductive via may penetrate the second photosensitive dielectric layer in the through hole to be connected to both of the first trace pattern and the first semiconductor chip.

According to an embodiment, a fan-out package may include a core supporter, a first semiconductor chip, a first semiconductor chip, a first photosensitive dielectric layer, a second photosensitive dielectric layer, a first trace pattern, and a first conductive via. The core supporter may have a through hole. The first semiconductor chip may be disposed on a first surface of the core supporter in a way that a portion of the first semiconductor chip is exposed by the through hole. The second semiconductor chip and a third semiconductor chip may be disposed side by side on a second surface of the core supporter in a way that the through hole is located between the second and third semiconductor chips. The first photosensitive dielectric layer may be disposed on the first surface of the core supporter to cover the first semiconductor chip. The second photosensitive dielectric layer may be disposed on the second surface of the core supporter to cover the second and third semiconductor chips and to fill the through hole. The first trace pattern may be disposed on the second photosensitive dielectric layer. The first conductive via may penetrate the second photosensitive dielectric layer in the through hole to be connected to both of the first trace pattern and the first semiconductor chip.

According to an embodiment, there is provided a method of fabricating a fan-out package. The method may include attaching a first semiconductor chip to a first surface of a core supporter having a through hole in a way that a portion of the first semiconductor chip is exposed by the through hole, forming a first photosensitive dielectric layer on the first surface of the core supporter to cover the first semiconductor chip, attaching a second semiconductor chip to a second surface of the core supporter facing away from the first photosensitive dielectric layer, forming a second photosensitive dielectric layer on the second surface of the core supporter to cover the second semiconductor chip and to fill the through hole, and forming a first trace pattern disposed on the second photosensitive dielectric layer and a first conductive via disposed in the second photosensitive dielectric layer. The first conductive via may penetrate the second photosensitive dielectric layer in the through hole to be connected to both of the first trace pattern and the first semiconductor chip.

According to an embodiment, there is provided a memory card including a semiconductor package. The semiconductor package may include a core supporter, a first semiconductor chip, a second semiconductor chip, a first photosensitive dielectric layer, a second photosensitive dielectric layer, a first trace pattern, and a first conductive via. The core supporter may have a through hole. The first semiconductor chip may be disposed on a first surface of the core supporter in a way that a portion of the first semiconductor chip is exposed by the through hole. The second semiconductor chip may be disposed on a second surface of the core supporter. The first photosensitive dielectric layer may be disposed on the first surface of the core supporter to cover the first semiconductor chip. The second photosensitive dielectric layer may be disposed on the second surface of the core supporter to cover the second semiconductor chip and to fill the through hole. The first trace pattern may be disposed on the second photosensitive dielectric layer. The first conductive via may penetrate the second photosensitive dielectric layer in the through hole to be connected to both of the first trace pattern and the first semiconductor chip.

According to an embodiment, there is provided a memory card including a semiconductor package. The semiconductor package may include a core supporter, a first semiconductor chip, a first semiconductor chip, a first photosensitive dielectric layer, a second photosensitive dielectric layer, a first trace pattern, and a first conductive via. The core supporter may have a through hole. The first semiconductor chip may be disposed on a first surface of the core supporter in a way that a portion of the first semiconductor chip is exposed by the through hole. The second semiconductor chip and a third semiconductor chip may be disposed side by side on a second surface of the core supporter in a way that the through hole is located between the second and third semiconductor chips. The first photosensitive dielectric layer may be disposed on the first surface of the core supporter to cover the first semiconductor chip. The second photosensitive dielectric layer may be disposed on the second surface of the core supporter to cover the second and third semiconductor chips and to fill the through hole. The first trace pattern may be disposed on the second photosensitive dielectric layer. The first conductive via may penetrate the second photosensitive dielectric layer in the through hole to be connected to both of the first trace pattern and the first semiconductor chip.

According to an embodiment, there is provided an electronic system including a semiconductor package. The semiconductor package may include a core supporter, a first semiconductor chip, a second semiconductor chip, a first photosensitive dielectric layer, a second photosensitive dielectric layer, a first trace pattern, and a first conductive via. The core supporter may have a through hole. The first semiconductor chip may be disposed on a first surface of the core supporter in a way that a portion of the first semiconductor chip is exposed by the through hole. The second semiconductor chip may be disposed on a second surface of the core supporter. The first photosensitive dielectric layer may be disposed on the first surface of the core supporter to cover the first semiconductor chip. The second photosensitive dielectric layer may be disposed on the second surface of the core supporter to cover the second semiconductor chip and to fill the through hole. The first trace pattern may be disposed on the second photosensitive dielectric layer. The first conductive via may penetrate the second photosensitive dielectric layer in the through hole to be connected to both of the first trace pattern and the first semiconductor chip.

According to an embodiment, there is provided an electronic system including a semiconductor package. The semiconductor package may include a core supporter, a first semiconductor chip, a first semiconductor chip, a first photosensitive dielectric layer, a second photosensitive dielectric layer, a first trace pattern, and a first conductive via. The core supporter may have a through hole. The first semiconductor chip may be disposed on a first surface of the core supporter in a way that a portion of the first semiconductor chip is exposed by the through hole. The second semiconductor chip and a third semiconductor chip may be disposed side by side on a second surface of the core supporter in a way that the through hole is located between the second and third semiconductor chips. The first photosensitive dielectric layer may be disposed on the first surface of the core supporter to cover the first semiconductor chip. The second photosensitive dielectric layer may be disposed on the second surface of the core supporter to cover the second and third semiconductor chips and to fill the through hole. The first trace pattern may be disposed on the second photosensitive dielectric layer, and a first conductive via penetrating the second photosensitive dielectric layer in the through hole to be connected to both of the first trace pattern and the first semiconductor chip.

BRIEF DESCRIPTION OF THE DRAWINGS

Various embodiments of the present disclosure will become more apparent in view of the attached drawings and accompanying detailed description, in which.

DETAILED DESCRIPTION

Figure 1:
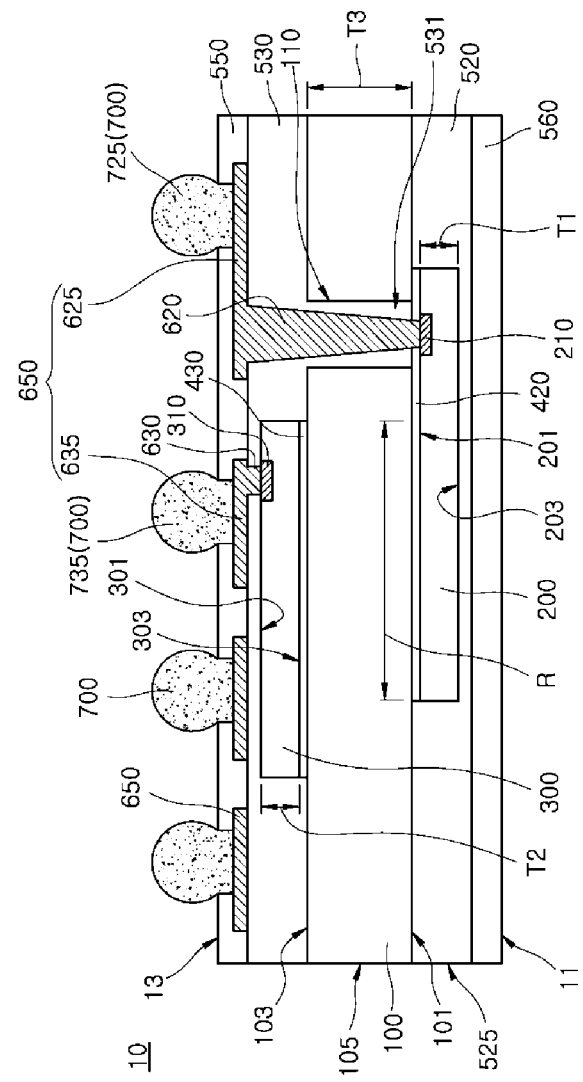
FIG. 1 is a cross-sectional view illustrating an example of a fan-out package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence.

Semiconductor packages according to the following embodiments may include semiconductor devices such as semiconductor dies or semiconductor chips, and the semiconductor dies or the semiconductor chips may be obtained by separating a semiconductor substrate such as a wafer including electronic circuits into a plurality of pieces (having semiconductor die shapes or semiconductor chip shapes) using a die sawing process. The semiconductor dies or the semiconductor chips may correspond to memory chips, logic chips or application specific integrated circuit (ASIC) chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips or the ASIC chips may include logic circuits which are integrated on the semiconductor substrate. The semiconductor packages may be employed in communication systems such as mobile phones, electronic systems associated with biotechnology or health care, or wearable electronic systems.

The same reference numerals refer to the same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
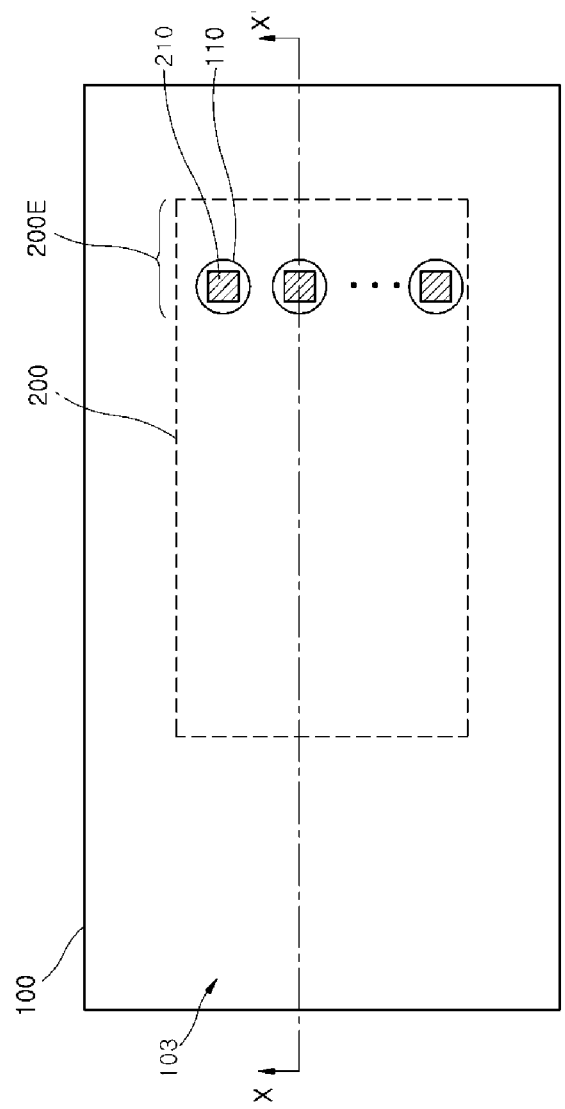
FIG. 2 is a layout diagram illustrating an example of a core supporter of the fan-out package shown in FIG. 1.

FIG. 1 is a cross-sectional view illustrating an example of a fan-out package 10 according to an embodiment, and FIG. 2 is a layout diagram illustrating an example of a core supporter 100 of the fan-out package 10 shown in FIG. 1. FIG. 1 is a cross-sectional view taken along a line X-X' of FIG. 2.

Referring to FIG. 1, the fan-out package 10 may include a first semiconductor chip 200 disposed on a first surface 101 of the core supporter 100 and a second semiconductor chip 300 disposed on a second surface 103 of the core supporter 100. The first and second surfaces 101 and 103 of the core supporter 100 may be opposite surfaces facing away from each other. Accordingly, the core supporter 100 may be disposed between the first and second semiconductor chips 200 and 300. A region R of the first semiconductor chip 200 may overlap at least a portion of the second semiconductor chip 300 when viewed from above. Thus, the first and second semiconductor chips 200 and 300 are disposed on the core supporter 100 to provide a stepwise shape.

The core supporter 100 may have a flat shape. The core supporter 100 may have a flat substrate or a flat plate. The core supporter 100 may function as a carrier that supports the first and second semiconductor chips 200 and 300. The core supporter 100 may be located between a bottom surface 11 and a top surface 13 of the fan-out package 10 to prevent the fan-out package 10 from warping or bending. That is, the fan-out package 10 may maintain its flat shape by having the core supporter 100 between the bottom surface 11 and the top surface 13 of the fan-out package 10 comprised of a rigid material. For example, the core supporter 100 may be comprised of a silicon material. Alternatively, the core supporter 100 may have a flat shape comprised of a glass material, a stainless steel material or an alloy of various metal materials. The core supporter 100 may have a thickness T3 greater than a thickness T1 of the first semiconductor chip 200 or a thickness T2 of the second semiconductor chip 300. In an embodiment, the core supporter 100 is thicker than the first and second semiconductor chips 200 and 300 so that the core supporter 100 is strong enough to support the first and second semiconductor chips 200 and 300. The thickness T3 of the core supporter 100 may be at least twice the thickness T1 of the first semiconductor chip 200 or the thickness T2 of the second semiconductor chip 300, and may be equal to or less than four times the thickness T1 of the first semiconductor chip 200 or the thickness T2 of the second semiconductor chip 300.

The core supporter 100 may be different from known structures such as interposers, built up interconnection layers, and printed circuit boards (PCBs) in that the core supporter 100 does not have any interconnection line in the core supporter 100 or on the first and second surfaces 101 and 103 of the core supporter 100, and thus the core supporter 100 may be a plate or a substrate containing materials such as a semiconductor material, an insulation material, and a metal material.

The first semiconductor chip 200 may be a memory chip or a logic chip. The first semiconductor chip 200 may include first chip connection terminals 210 disposed on a third surface 201 of the first semiconductor chip 200 facing the first surface 101 of the core supporter 100. The first chip connection terminals 210 may be disposed on the third surface 201, and may have a pad shape. The first semiconductor chip 200 may be a flip chip mounted on the first surface 101 of the core supporter 100 so that the first chip connection terminals 210 face the first surface 101 of the core supporter 100.

The first semiconductor chip 200 may be bonded to the core supporter 100 by a first adhesive layer 420 disposed between the first semiconductor chip 200 and the core supporter 100. The first adhesive layer 420 may correspond to a permanent bonding layer acting as an element of the fan-out package 10. The first adhesive layer 420 may include an epoxy material.

The first semiconductor chip 200 may be bonded to the core supporter 100 in a way that at least one of the first chip connection terminals 210 of the first semiconductor chip 200 is aligned with any one of through holes 110 penetrating the core supporter 100. The through holes 110 may extend from the first surface 101 of the core supporter 100 to the second surface 103 of the core supporter 100. As illustrated in FIG. 2, the through holes 110 may overlap the first chip connection terminals 210 of the first semiconductor chip 200, respectively. That is, if a plurality of the first chip connection terminals 210 is provided, the core supporter 100 may have a plurality of the through holes 110, and each first chip connection terminal 210 may overlap each through hole 110. The first chip connection terminals 210 may be disposed on an edge region 200E of the third surface 201 of the first semiconductor chip 200, and the through holes 110 may be aligned such that at least a portion of each first chip connection terminal 210 is exposed through each through hole 110. The first semiconductor chip 200 may be attached to the core supporter 100 in a way that the first chip connection terminals 210 may be exposed by the through holes 110.

The second semiconductor chip 300 may be a memory chip or a logic chip. The second semiconductor chip 300 may have a fifth surface 301 and a sixth surface 303, which are opposite surfaces facing away from each other. The second semiconductor chip 300 may be mounted on the second surface 103 of the core supporter 100 in a way that the sixth surface 303 of the second semiconductor chip 300 faces the second surface 103 of the core supporter 100. Here, second chip connection terminals 310 may be disposed on the fifth surface 301 of the second semiconductor chip 300, which is an opposite surface of the sixth surface 303 on which the core supporter 100 is disposed. The second chip connection terminals 310 may have a pad shape. The second semiconductor chip 300 disposed on the core supporter 100 may expose the through holes 110 of the core supporter 100 and overlap the region R of the first semiconductor chip 200.

The second semiconductor chip 300 may be bonded to the core supporter 100 by a second adhesive layer 430 disposed between the sixth surface 303 of the second semiconductor chip 300 and the second surface 103 of the core supporter 100. The second adhesive layer 430 may correspond to a permanent bonding layer acting as an element of the fan-out package 10. The first and second adhesive layers 420 and 430 may act as permanent bonding layers that fix the first and second semiconductor chips 200 and 300 to the core supporter 100. Thus, the first and second adhesive layers 420 and 430 may prevent the first and second semiconductor chips 200 and 300 from moving out of their positions.

The fan-out package 10 may further include a first photosensitive dielectric layer 520, which covers the first semiconductor chip 200. Sidewalls 105 of the core supporter 100 may be vertically aligned with sidewalls 525 of the first photosensitive dielectric layer 520, respectively. The first photosensitive dielectric layer 520 may include a polymer layer that contains a photosensitive material such as photosensitive polyimide or photosensitive polybenzoxazole. The first photosensitive dielectric layer 520 may include a direct imaging film. The first photosensitive dielectric layer 520 may be disposed on the first surface 101 of the core supporter 100, and may cover the first semiconductor chip 200. The fourth surface 203 of the first semiconductor chip 200 may be in contact with the first photosensitive dielectric layer 520.

The fan-out package 10 may further include a second photosensitive dielectric layer 530, which covers the second semiconductor chip 300. The second photosensitive dielectric layer 530 may include the same or substantially the same material as the first photosensitive dielectric layer 520, and may have the same or substantially the same thickness as the first photosensitive dielectric layer 520. The second photosensitive dielectric layer 530 may be disposed on the second surface 103 of the core supporter 100, which is an opposite surface of the first surface 101 on which the first photosensitive dielectric layer 520 is disposed. The core supporter 100 may be disposed between the first and second photosensitive dielectric layers 520 and 530. The second photosensitive dielectric layer 530 may be disposed on the second surface 103 of the core supporter 100, and may cover the second semiconductor chip 300. The fifth surface 301 of the second semiconductor chip 300 may be in contact with the second photosensitive dielectric layer 530. The second photosensitive dielectric layer 530 may fill the through holes 110 of the core supporter 100 adjacent to the second semiconductor chip 300.

The fan-out package 10 may further include first conductive vias 620, which penetrate the second photosensitive dielectric layer 530 and are electrically and mechanically connected to the first chip connection terminals 210. The first conductive vias 620 may extend into the through holes 110 to contact the first chip connection terminals 210. The first conductive vias 620 may penetrate a portion 531 of the second photosensitive dielectric layer 530 filling the through holes 110. Sidewalls of the first conductive vias 620 may be surrounded by the portion 531 of the second photosensitive dielectric layer 530 in the through holes 110 to be laterally separated or electrically insulated from the core supporter 100. Thus, even if the core supporter 100 is comprised of a conductive material or a semiconductor material, the first conductive vias 620 may be electrically insulated from the core supporter 100.

The fan-out package 10 may further include second conductive vias 630, which penetrate the second photosensitive dielectric layer 530 to be electrically and mechanically connected to the second chip connection terminals 310 of the second semiconductor chip 300.

The fan-out package 10 may further include trace patterns 650 disposed on the second photosensitive dielectric layer 530 and electrically connected to the first and second semiconductor chips 200 and 300 through the first and second conductive vias 620 and 630. Although FIG. 1 illustrates an example in which the trace patterns 650 have a single layered structure, the present disclosure is not limited thereto. For example, in some embodiments, each of the trace patterns 650 may have a multi-layered structure.

The trace patterns 650 may be interconnects that electrically connect the first and second semiconductor chips 200 and 300 to an external device. First trace patterns 625, among the trace patterns 650, may be connected to the first conductive vias 620. The first trace patterns 625 may have a portion that is disposed on the second photosensitive dielectric layer 530 and, when viewed from above, does not overlap the first semiconductor chip 200. Thus, first outer connectors 725 connected to the first trace patterns 625 may also be located at a position that does not overlap the first semiconductor chip 200, when viewed from above. In addition, the first outer connectors 725 may be located at a position that does not overlap the second semiconductor chip 300, when viewed from above.

Second trace patterns 635, among the trace patterns 650, may be connected to the second conductive vias 630. The second trace patterns 635 may be disposed on the second photosensitive dielectric layer 530 at a position that does not overlap the second semiconductor chip 300 when viewed from above. Second outer connectors 735 connected to the second trace patterns 635 may also be located at a position that overlaps the second semiconductor chip 300 when viewed from above. Alternatively, the second outer connectors 735 may be located at a position that does not overlap the second semiconductor chip 300.

The first and second outer connectors 725 and 735 may constitute outer connectors 700, and the outer connectors 700 may be attached to the trace patterns 650 to electrically connect the fan-out package 10 to an external device. The outer connectors 700 may be connection members such as solder balls. A third photosensitive dielectric layer 550 may be disposed on the second photosensitive dielectric layer 530, and may cover the trace patterns 650. In such a case, the outer connectors 700 may penetrate the third photosensitive dielectric layer 550 to be connected to the trace patterns 650, and a portion of each outer connector 700 may protrude from a surface of the third photosensitive dielectric layer 550.

A fourth photosensitive dielectric layer 560 may be disposed on a surface of the first photosensitive dielectric layer 520 facing away from the core supporter 100. The fourth photosensitive dielectric layer 560 may contain the same or substantially the same material as the third photosensitive dielectric layer 550, and may have the same or substantially the same thickness as the third photosensitive dielectric layer 550. The third and fourth photosensitive dielectric layers 550 and 560 may be located at positions symmetric to each other with respect to the core supporter 100.

The fan-out package 10 may have some stack structures that are disposed over and under the core supporter 100 and are symmetric with respect to the core supporter 100. For example, the fan-out package 10 may have symmetrical pairs of structures that are disposed over and under the core supporter 100 and are symmetric with respect to the core supporter 100. In an embodiment, a stack structure including the first semiconductor chip 200, the first photosensitive dielectric layer 520, and the fourth photosensitive dielectric layer 560 stacked on the first surface 101 of the core supporter 100 may be disposed on an opposite side (e.g., positions symmetric with respect to the core supporter 100) of a stack structure including the second semiconductor chip 300, the second photosensitive dielectric layer 530, and the third photosensitive dielectric layer 550 stacked on the second surface 103 of the core supporter 100. Thus, the fan-out package 10 may have a structure that is effective in suppressing warpage.

Figure 3:
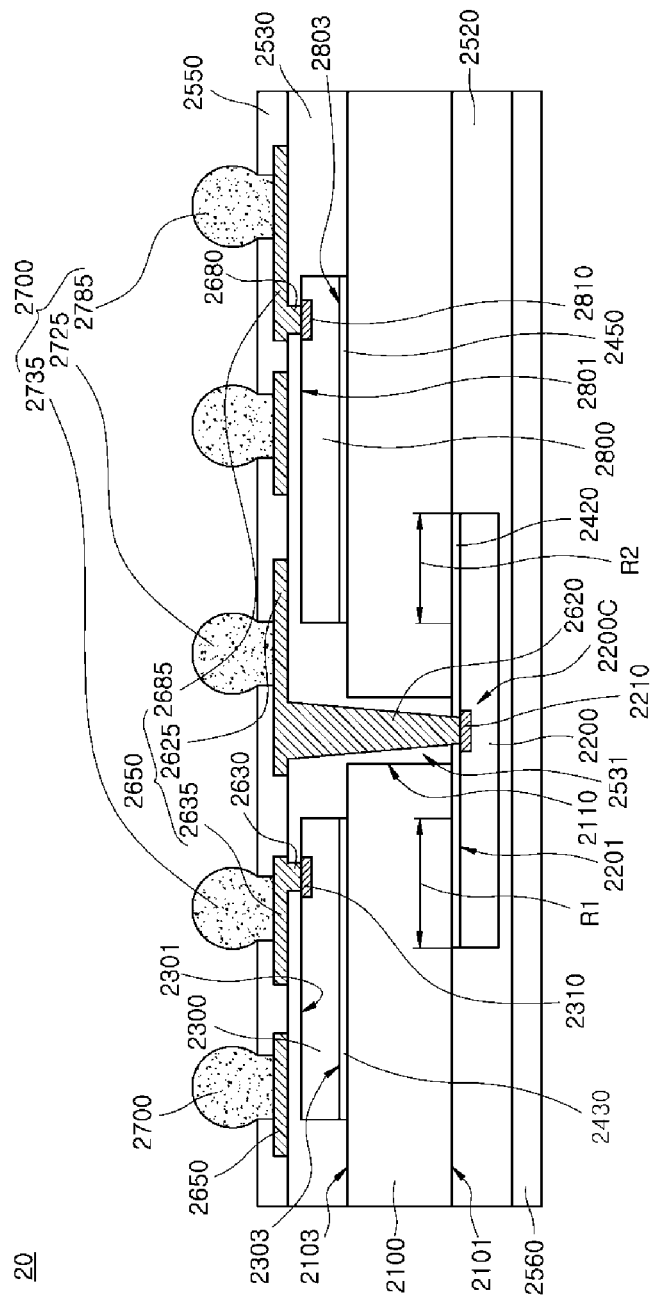
FIG. 3 is a cross-sectional view illustrating an example of a fan-out package according to an embodiment.

FIG. 3 is a cross-sectional view illustrating an example of a fan-out package 20 according to another embodiment.

Referring to FIG. 3, the fan-out package 20 may include a first semiconductor chip 2200 disposed on a first surface 2101 of a core supporter 2100, and may also include a second semiconductor chip 2300 and a third semiconductor chip 2800 disposed side by side on a second surface 2103 of the core supporter 2100. The first and second surfaces 2101 and 2103 of the core supporter 2100 may be opposite surfaces facing away from each other. Accordingly, the first semiconductor chip 2200 may be disposed on the first surface 2101 of the core supporter 2100, which is the opposite surface of the second surface 2103 on which the second semiconductor chip 2300 and the third semiconductor chip 2800 are disposed. A region R1 of the first semiconductor chip 2200 may overlap at least a portion of the second semiconductor chip 2300 when viewed from above, and a region R2 of the first semiconductor chip 2200 may overlap at least a portion of the third semiconductor chip 2800 when viewed from above. The first semiconductor chip 2200 may be a logic chip. The second semiconductor chip 2300 may be a memory chip such as a DRAM chip. The third semiconductor chip 2800 may be another memory chip.

First chip connection terminals 2210 may be disposed on a third surface 2201 of the first semiconductor chip 2200 facing the first surface 2101 of the core supporter 2100. That is, the first semiconductor chip 2200 may be a flip chip. The first chip connection terminals 2210 may be disposed on a central region 2200C of the third surface 2201 of the first semiconductor chip 2200. The first semiconductor chip 2200 may be bonded to the first surface 2101 of the core supporter 2100 by a first adhesive layer 2420. For example, the first semiconductor chip 2200 may be permanently fixed to the core supporter 2100. The first semiconductor chip 2200 may be bonded to the core supporter 2100 in a way that the first chip connection terminals 2210 of the first semiconductor chip 2200 are aligned with through holes 2110 penetrating the core supporter 2100.

The second semiconductor chip 2300 may include second chip connection terminals 2310 disposed on a fifth surface 2301 of the second semiconductor chip 2300 facing away from the core supporter 2100. The second semiconductor chip 2300 may be mounted on the second surface 2103 of the core supporter 2100 so that a sixth surface 2303 of the second semiconductor chip 2300 faces away from the fifth surface 2301 and faces the second surface 2103 of the core supporter 2100. The second semiconductor chip 2300 may expose the through holes 2110 of the core supporter 2100. The sixth surface 2303 of the second semiconductor chip 2300 may be bonded to the second surface 2103 of the core supporter 2100 by a second adhesive layer 2430.

The third semiconductor chip 2800 may be disposed on the second surface 2103 of the core supporter 2100 in a way that the through holes 2110 are located under a region between the second and third semiconductor chips 2300 and 2800. Third chip connection terminals 2810 may be disposed on a seventh surface 2801 of the third semiconductor chip 2800 facing away from the core supporter 2100. The third semiconductor chip 2800 may be mounted on the second surface 2103 of the core supporter 2100 in a way that a eighth surface 2803 of the third semiconductor chip 2800 faces away from the seventh surface 2801 and faces the second surface 2103 of the core supporter 2100. The third semiconductor chip 2800 may expose the through holes 2110 of the core supporter 2100. The eighth surface 2803 of the third semiconductor chip 2800 may be bonded to the second surface 2103 of the core supporter 2100 by a third adhesive layer 2450.

The fan-out package 20 may further include a first photosensitive dielectric layer 2520, which covers the first semiconductor chip 2200. The fan-out package 20 may further include a second photosensitive dielectric layer 2530, which covers the second and third semiconductor chips 2300 and 2800. The second photosensitive dielectric layer 2530 may extend to fill the through holes 2110 exposed between the second and third semiconductor chips 2300 and 2800.

The fan-out package 20 may further include first conductive vias 2620, which penetrate the second photosensitive dielectric layer 2530 and are electrically and mechanically connected to the first chip connection terminals 2210 of the first semiconductor chip 2200. The first conductive vias 2620 may extend into the through holes 2110 to contact the first chip connection terminals 2210. The first conductive vias 2620 may penetrate a portion 2531 of the second photosensitive dielectric layer 2530 filling the through holes 2110. Sidewalls of the first conductive vias 2620 may be surrounded by the portion 2531 of the second photosensitive dielectric layer 2530 in the through holes 2110 to be laterally separated or electrically insulated from the core supporter 2100. The fan-out package 20 may further include second conductive vias 2630, which penetrate the second photosensitive dielectric layer 2530 and are electrically and mechanically connected to the second chip connection terminals 2310 of the second semiconductor chip 2300. The fan-out package 20 may further include third conductive vias 2680, which penetrate the second photosensitive dielectric layer 2530 and are electrically and mechanically connected to the third chip connection terminals 2810 of the third semiconductor chip 2800.

The fan-out package 20 may further include trace patterns 2650 disposed on the second photosensitive dielectric layer 2530 and electrically connected to the first to third semiconductor chips 2200, 2300 and 2800 through the first to third conductive vias 2620, 2630 and 2680. First trace patterns 2625, among the trace patterns 2650, may be connected to the first conductive vias 2620. The first trace patterns 2625 may be disposed on the second photosensitive dielectric layer 2530, and may overlap the first semiconductor chip 2200 when viewed from above. Second trace patterns 2635, among the trace patterns 2650, may be connected to the second conductive vias 2630. The second trace patterns 2635 may be disposed on the second photosensitive dielectric layer 2530, and may overlap the second semiconductor chip 2300. Third trace patterns 2685, among the trace patterns 2650, may be connected to the third conductive vias 2680, and may extend to a portion of a top surface of the second photosensitive dielectric layer 2530 that does not overlap the third semiconductor chip 2800 when viewed from above.

First outer connectors 2725 attached to the first trace patterns 2625 may be located at a position that overlaps the first semiconductor chip 2200 when viewed from above. Second outer connectors 2735 attached to the second trace patterns 2635 may be located at a position that overlaps the second semiconductor chip 2300. Third outer connectors 2785 attached to the third trace patterns 2685 may be located at a position that does not overlap the third semiconductor chip 2800 when viewed from above. The first to third outer connectors 2725, 2735 and 2785 may constitute outer connectors 2700, and the outer connectors 2700 may be attached to the trace patterns 2650 to electrically connect the fan-out package 20 to an external device.

A third photosensitive dielectric layer 2550 may be disposed on the second photosensitive dielectric layer 2530 to cover the trace patterns 2650. Here, the outer connectors 2700 may penetrate the third photosensitive dielectric layer 2550 to be connected to the trace patterns 2650, and a portion of each of the outer connectors 2700 may protrude from a surface of the third photosensitive dielectric layer 2550. A fourth photosensitive dielectric layer 2560 may be disposed on a surface of the first photosensitive dielectric layer 2520 facing away from the core supporter 2100.

FIGS. 4 to 8 are cross-sectional views illustrating an example of a method of fabricating a fan-out package according to an embodiment.

Figure 4:
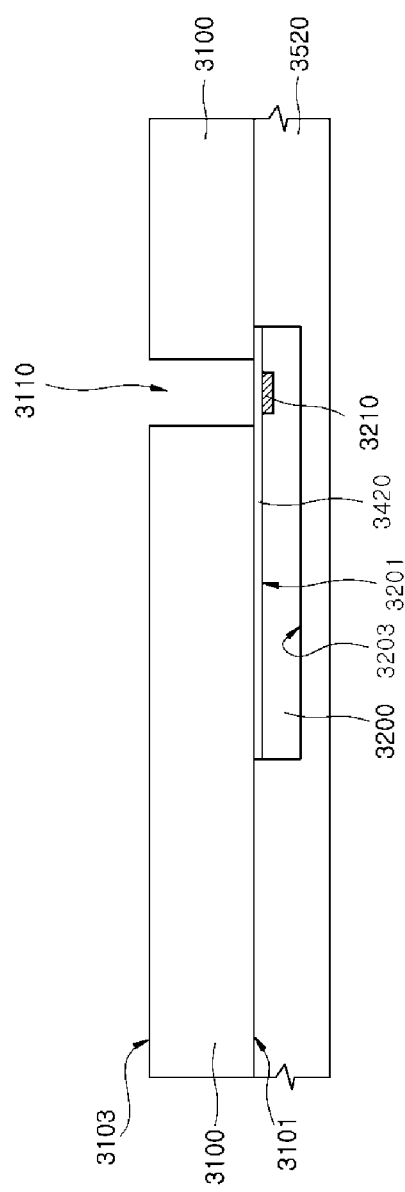
FIGS. 4 to 8 are cross-sectional views illustrating an example of a method of fabricating a fan-out package according to an embodiment.

Referring to FIG. 4, a core supporter 3100 having a first surface 3101 and a second surface 3103 may be provided. The first surface 3101 and the second surface 3103 may be opposite surfaces facing away from each other. The core supporter 3100 may have a wafer shape to which a wafer level package technique is applicable. Alternatively, the core supporter 3100 may have a flat shape (e.g., a panel shape or a substrate shape). Through holes 3110 may be formed to penetrate the core supporter 3100.

A first semiconductor chip 3200 may be attached to the first surface 3101 of the core supporter 3100. The first semiconductor chip 3200 may have a third surface 3201 and a fourth surface 3203 which are opposite surfaces facing away from each other, and first chip connection terminals 3210 may be formed on the third surface 3201 of the first semiconductor chip 3200. The first semiconductor chip 3200 may be bonded to the core supporter 3100 using flip chip bonding in a way that the first chip connection terminals 3210 of the first semiconductor chip 3200 face the through holes 3110 of the core supporter 3100. The first semiconductor chip 3200 may be disposed on the first surface 3101 of the core supporter 3100 in a way that the first chip connection terminals 3210 are aligned with the through holes 3110 of the core supporter 3100. The third surface 3201 of the first semiconductor chip 3200 may be bonded to the first surface 3101 of the core supporter 3100 by a first adhesive layer 3420.

A first photosensitive dielectric layer 3520 may be formed on the first surface 3101 of the core supporter 3100 to cover the first semiconductor chip 3200. The first photosensitive dielectric layer 3520 may be formed on the first surface 3101 of the core supporter 3100 using a lamination process such that the first semiconductor chip 3200 is embedded in the first photosensitive dielectric layer 3520. As a result, the fourth surface 3203 of the first semiconductor chip 3200, which is an opposite surface of the third surface 3201 on which the core supporter 3100 is disposed, may be in contact with the first photosensitive dielectric layer 3520.

If it is necessary to reduce a thickness of the core supporter 3100, the second surface 3103 of the core supporter 3100, for example, may be recessed. The thickness of the second surface 3103 of the core supporter 3100 may be reduced using a grinding process.

Figure 5:
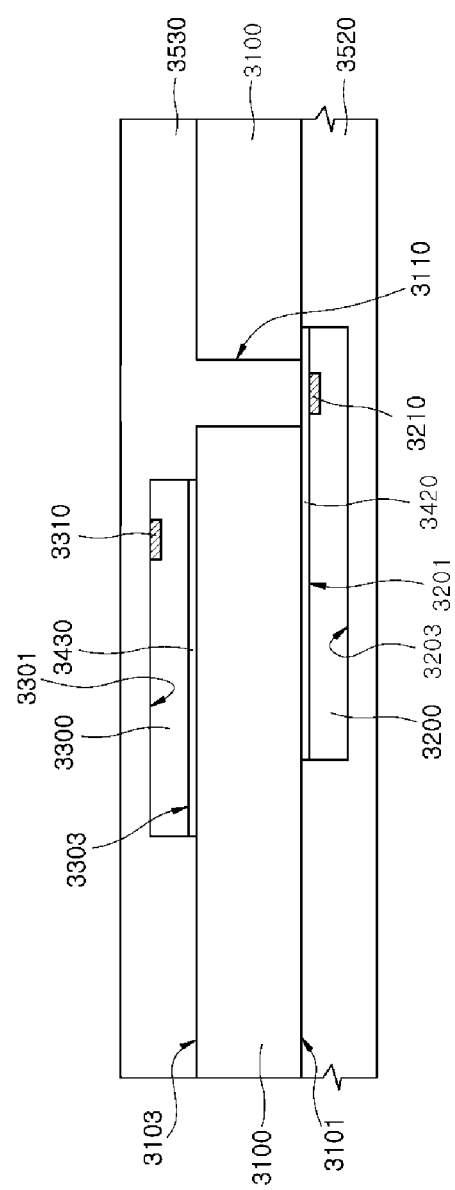

Referring to FIG. 5, a second semiconductor chip 3300 may be attached to the second surface 3103 of the core supporter 3100. The second semiconductor chip 3300 may have a fifth surface 3301 and a sixth surface 3303, which are opposite surfaces facing away from each other, and second chip connection terminals 3310 may be formed on the fifth surface 3301 of the second semiconductor chip 3300. The second semiconductor chip 3300 may be mounted on the core supporter 3100 in a way that the sixth surface 3303 of the second semiconductor chip 3300 faces the second surface 3103 of the core supporter 3100. The second semiconductor chip 3300 may be permanently bonded to the core supporter 3100 using a second adhesive layer 3430 disposed between the sixth surface 3303 of the second semiconductor chip 3300 and the second surface 3103 of the core supporter 3100.

A second photosensitive dielectric layer 3530 may be formed on the second surface 3103 of the core supporter 3100 to cover the second semiconductor chip 3300. The second photosensitive dielectric layer 3530 may be formed on the second surface 3103 of the core supporter 3100 using a lamination process such that the second semiconductor chip 3300 is embedded in the first photosensitive dielectric layer 3520. As a result, a fourth surface 3203 of the first semiconductor chip 3200, which is an opposite surface of the third surface 3201 on which the core supporter 3100 is disposed, may be in contact with the first photosensitive dielectric layer 3520. When the second photosensitive dielectric layer 3530 is formed, a portion 3531 of the second photosensitive dielectric layer 3530 may fill the through holes 3110.

Figure 6:
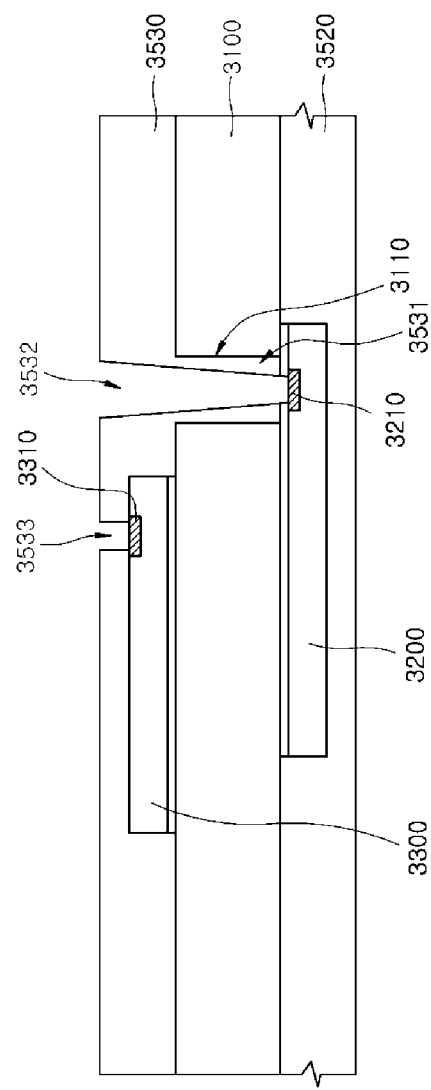

Referring to FIG. 6, some portions of the second photosensitive dielectric layer 3530 may be selectively exposed to a light such as an ultraviolet (UV) ray, and the exposed second photosensitive dielectric layer 3530 may be developed using a developer. As a result, the first and second openings 3532 and 3533 may be formed in the second photosensitive dielectric layer 3530. The first openings 3532 may be formed to penetrate the second photosensitive dielectric layer 3530 and to expose the first chip connection terminals 3210 of the first semiconductor chip 3200. The first openings 3532 may be formed to penetrate a portion 3531 of the second photosensitive dielectric layer 3530 filling the through holes 3110. The second openings 3533 may be formed to penetrate the second photosensitive dielectric layer 3530 and to expose the second chip connection terminals 3310 of the second semiconductor chip 3300. The first and second openings 3532 and 3533 may be formed by directly applying a photolithography process to the second photosensitive dielectric layer 3530 without using any additional photoresist layer.

After the first and second openings 3532 and 3533 are formed, a curing process such as a baking process may be performed on the first and second photosensitive dielectric layers 3520 and 3530. After performing the curing process on the first and second photosensitive dielectric layers 3520 and 3530, the first and second photosensitive dielectric layers 3520 and 3530 may be hardened to act as an encapsulant part that encapsulates and protects the first and second semiconductor chips 3200 and 3300. While the curing process is being performed on the first and second photosensitive dielectric layers 3520 and 3530, a stress may be caused in the first and second photosensitive dielectric layers 3520 and 3530. If the first photosensitive dielectric layer 3520 is absent, the stress generated in the second photosensitive dielectric layer 3530 may cause the core supporter 3100 to warp. However, in an embodiment, the first and second photosensitive dielectric layers 3520 and 3530 are located at positions symmetric to each other with respect to the core supporter 3100. Thus, the stress generated in the first photosensitive dielectric layer 3520 may be offset by the stress generated in the second photosensitive dielectric layer 3530 to suppress warpage of the core supporter 3100.

Figure 7:
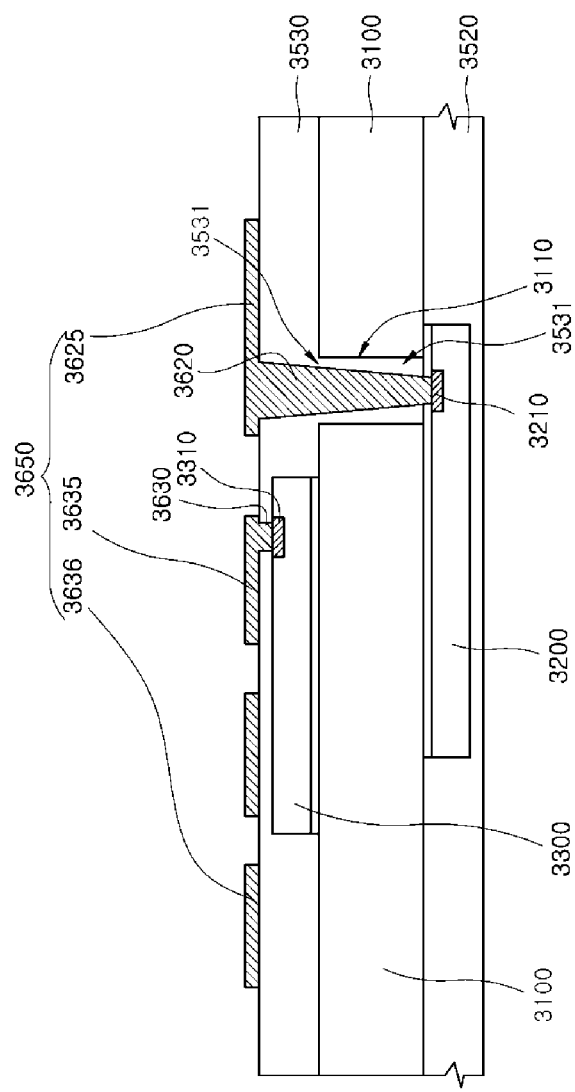

Referring to FIG. 7, first conductive vias 3620 filling the first openings 3532 to contact the first chip connection terminals 3210 and first trace patterns 3625 extending from the first conductive vias 3620 to a portion of a top surface of the second photosensitive dielectric layer 3530 may be formed. The first conductive vias 3620 and the first trace patterns 3625 may be formed using a plating process. When the first conductive vias 3620 and the first trace patterns 3625 are formed, second conductive vias 3630 may fill the second openings 3533 to contact the second chip connection terminals 3310, and second trace patterns 3635 extending from the second conductive vias 3630 to a portion of a top surface of the second photosensitive dielectric layer 3530 may also be formed. In addition, when the first conductive vias 3620 and the first trace patterns 3625 are formed, third trace patterns 3636 may also be formed on the second photosensitive dielectric layer 3530. Trace patterns 3650 including the first, second, and third trace patterns 3625, 3635, and 3636, and the first and second conductive vias 3620 and 3630 may be formed using a single step of a plating process. The trace patterns 3650 and the first and second conductive vias 3620 and 3630 may contain a copper material.

Figure 8:
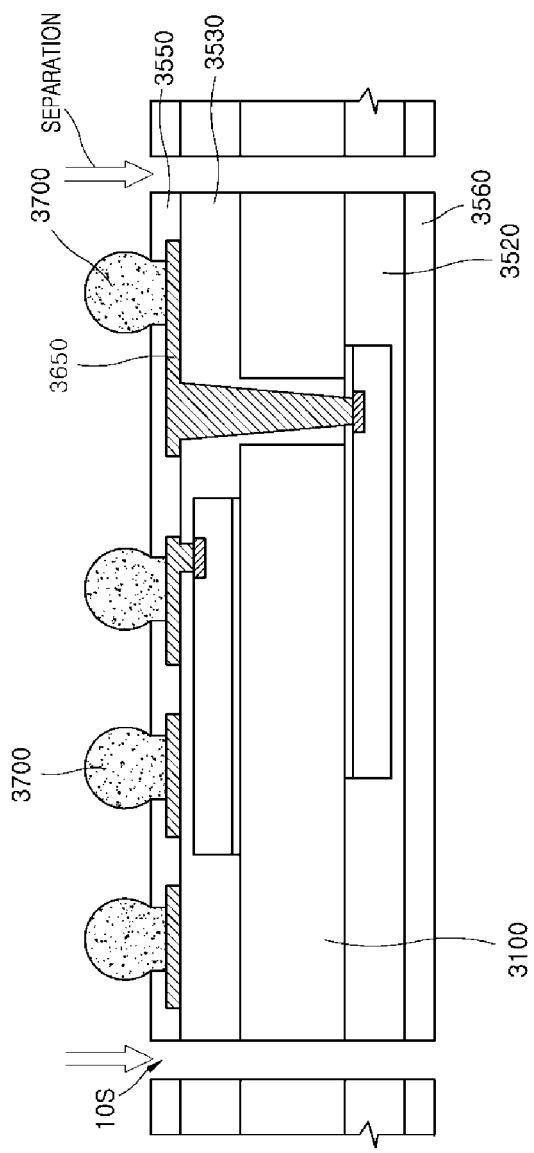

Referring to FIG. 8, a third photosensitive dielectric layer 3550 may be formed on the second photosensitive dielectric layer 3530 to cover the trace patterns 3650 and the first and second conductive vias 3620 and 3630. A fourth photosensitive dielectric layer 3560 may be formed on the first photosensitive dielectric layer 3520. The fourth photosensitive dielectric layer 3560 may be formed at a position symmetric to the third photosensitive dielectric layer 3550 with respect to the core supporter 3100. The third photosensitive dielectric layer 3550 may be patterned using a photolithography process to expose the trace patterns 3650. Subsequently, a curing process such as a baking process may be performed on the third and fourth photosensitive dielectric layers 3550 and 3560. Since the third and fourth photosensitive dielectric layers 3550 and 3560 are symmetric to each other with respect to the core supporter 3100, warpage problems of the core supporter 3100 may be suppressed while the curing process is being performed on the third and fourth photosensitive dielectric layers 3550 and 3560.

Outer connectors 3700 may be attached to the exposed trace patterns 3650. The outer connectors 3700 may be attached to the exposed trace patterns 3650 using a solder ball mounting process.

After the outer connectors 3700 are formed, a substrate including the core supporter 3100 and the photosensitive dielectric layers 3520, 3530, 3550, and 3560 may be separated into a plurality of packages 10S using a singulation process such as a die sawing process. Each of the packages 10S may have substantially the same structure as the fan-out package 10 illustrated in FIG. 1.

Figure 9:
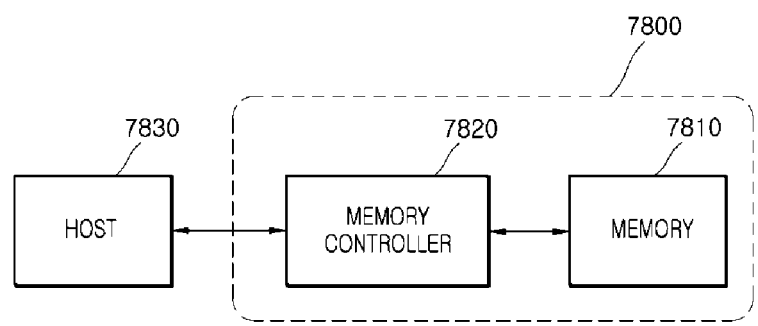
FIG. 9 is a diagram illustrating an example of an electronic system employing a memory card including at least one fan-out package according to some embodiments.

FIG. 9 is a diagram illustrating an example of an electronic system including a memory card 7800 including at least one of the fan-out packages according to some embodiments. The memory card 7800 includes a memory 7810, such as a nonvolatile memory device and a memory controller 7820. The memory 7810 and the memory controller 7820 may store data or read stored data. The memory 7810 and/or the memory controller 7820 may include at least one of the fan-out packages according to some embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 10:
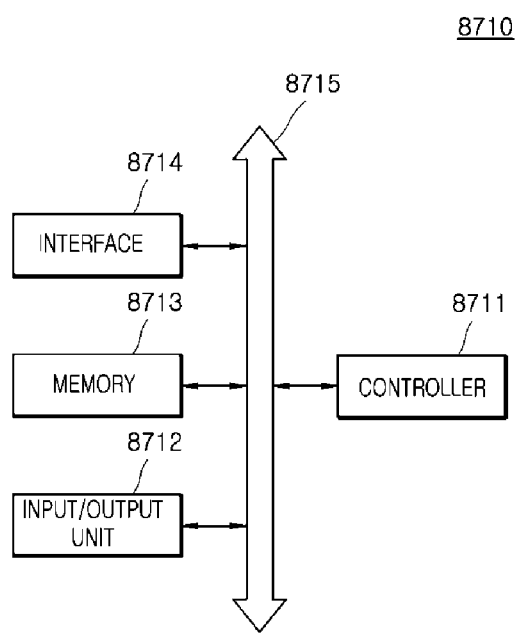
FIG. 10 is a diagram illustrating an example of an electronic system including at least one fan-out package according to some embodiments.

FIG. 10 is a diagram illustrating an example of an electronic system 8710 including at least one of the fan-out packages according to some embodiments. The electronic system 8710 may include a controller 8711, an input/output device 8712, and a memory 8713. The controller 8711, the input/output device 8712, and the memory 8713 may be coupled to one another through a bus 8715 providing a path through which data signals move.

In an embodiment, the controller 8711 may include one or more of a microprocessor, a digital signal processor, a microcontroller, and a logic device capable of performing the same functions as these components. The controller 8711 or the memory 8713 may include one or more of the fan-out packages according to an embodiment of the present disclosure. The input/output device 8712 may include at least one of a keypad, a keyboard, a display device, and a touchscreen. The memory 8713 is a device for storing data. The memory 8713 may store data and/or commands to be executed by the controller 8711.

The memory 8713 may include a volatile memory device such as a DRAM and/or a nonvolatile memory device such as a flash memory. For example, a flash memory may be installed in an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 transmitting and receiving data to and from a communication network. The interface 8714 may be a wired or wireless type. For example, the interface 8714 may include an antenna or a wired or wireless transceiver.

The electronic system 8710 may be realized in a form of a mobile system, a personal computer, an industrial computer or a logic system performing various functions. For example, examples of the mobile system may include a personal digital assistant (PDA), a portable computer, a tablet computer, a mobile phone, a smart phone, a wireless phone, a laptop computer, a memory card, a digital music system, and an information transmission/reception system.

If the electronic system 8710 may perform wireless communication, the electronic system 8710 may be used in a communication system such as CDMA (code division multiple access), GSM (global system for mobile communications), NADC (north American digital cellular), E-TDMA (enhanced-time division multiple access), WCDAM (wideband code division multiple access), CDMA2000, LTE (long term evolution), and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A fan-out package comprising:
   a core supporter having a through hole;
   a first semiconductor chip disposed on a first surface of the core supporter, a portion of the first semiconductor chip being exposed by the through hole;
   a second semiconductor chip disposed on a second surface of the core supporter;
   a first photosensitive dielectric layer disposed on the first surface of the core supporter to cover the first semiconductor chip;
   a second photosensitive dielectric layer disposed on the second surface of the core supporter to cover the second semiconductor chip and to fill the through hole;
   a first trace pattern disposed on the second photosensitive dielectric layer; and
   a first conductive via penetrating the second photosensitive dielectric layer in the through hole to be connected to both of the first trace pattern and the first semiconductor chip.

2. The fan-out package of claim 1, wherein the first semiconductor chip includes a first chip connection terminal exposed by the through hole, and the first conductive via is connected to the first chip connection terminal.

3. The fan-out package of claim 1, further comprising a first adhesive layer fixing the first semiconductor chip to the first surface of the core supporter.

4. The fan-out package of claim 1, wherein the second semiconductor chip is disposed on the second surface of the core supporter to expose the through hole.

5. The fan-out package of claim 1, wherein the second semiconductor chip is disposed on the second surface of the core supporter to overlap at least a portion of the first semiconductor chip when viewed from above so that the first and second semiconductor chips provide a stepwise shape.

6. The fan-out package of claim 1, further comprising:
a second trace pattern disposed on the second photosensitive dielectric layer; and
a second conductive via penetrating the second photosensitive dielectric layer to be connected to both of the second trace pattern and the second semiconductor chip.

7. The fan-out package of claim 1, wherein the first trace pattern extends to a portion of a top surface of the second photosensitive dielectric layer that does not overlap the first semiconductor chip when viewed from above.

8. The fan-out package of claim 1, wherein the first conductive via is insulated from the core supporter by a portion of the second photosensitive dielectric layer filling the through hole.

9. The fan-out package of claim 1, wherein the core supporter is thicker than the first semiconductor chip.

10. The fan-out package of claim 1, wherein the first photosensitive dielectric layer contains the same or substantially the same material as the second photosensitive dielectric layer and has the same or substantially the same thickness as the second photosensitive dielectric layer.

11. The fan-out package of claim 1, further comprising:
a third photosensitive dielectric layer disposed on the second photosensitive dielectric layer to cover the first trace pattern; and
a fourth photosensitive dielectric layer disposed on the first photosensitive dielectric layer.

12. The fan-out package of claim 11, wherein the fourth photosensitive dielectric layer contains the same or substantially the same material as the third photosensitive dielectric layer and has the same or substantially the same thickness as the third photosensitive dielectric layer.

13. The fan-out package of claim 11, further comprising an outer connector penetrating the third photosensitive dielectric layer to be connected to the first trace pattern.

14. The fan-out package of claim 1, wherein the first photosensitive dielectric layer exposes sidewalls of the core supporter.

15. A fan-out package comprising:
a core supporter having a through hole;
a first semiconductor chip disposed on a first surface of the core supporter, a portion of the first semiconductor chip being exposed by the through hole;
a second semiconductor chip and a third semiconductor chip disposed side by side on a second surface of the core supporter, the through hole being located between the second and third semiconductor chips;
a first photosensitive dielectric layer disposed on the first surface of the core supporter to cover the first semiconductor chip;
a second photosensitive dielectric layer disposed on the second surface of the core supporter to cover the second and third semiconductor chips and to fill the through hole;
a first trace pattern disposed on the second photosensitive dielectric layer; and
a first conductive via penetrating the second photosensitive dielectric layer in the through hole to be connected to both of the first trace pattern and the first semiconductor chip.

16. The fan-out package of claim 15, wherein the second semiconductor chip is disposed on the second surface of the core supporter to overlap a portion of the first semiconductor chip when viewed from above, and the third semiconductor chip is disposed on the second surface of the core supporter to overlap another portion of the first semiconductor chip when viewed from above.

17. The fan-out package of claim 15, wherein the first semiconductor chip has a first chip connection terminal disposed on a central region of the first semiconductor chip, and the first chip connection terminal is aligned with and exposed by the through hole.

18. The fan-out package of claim 15, further comprising:
a second trace pattern disposed on the second photosensitive dielectric layer;
a third trace pattern disposed on the second photosensitive dielectric layer at a position that does not overlap the third semiconductor chip when viewed from above;
a second conductive via penetrating the second photosensitive dielectric layer to be connected to both of the second trace pattern and the second semiconductor chip; and
a third conductive via penetrating the second photosensitive dielectric layer to be connected to both of the third trace pattern and the third semiconductor chip.

19. An electronic system including a package, the package comprising:
a core supporter having a through hole;
a first semiconductor chip disposed on a first surface of the core supporter, a portion of the first semiconductor chip being exposed by the through hole;
a second semiconductor chip and a third semiconductor chip disposed side by side on a second surface of the core supporter, wherein the through hole is located between the second and third semiconductor chips;
a first photosensitive dielectric layer disposed on the first surface of the core supporter to cover the first semiconductor chip;
a second photosensitive dielectric layer disposed on the second surface of the core supporter to cover the second and third semiconductor chips and to fill the through hole;
a first trace pattern disposed on the second photosensitive dielectric layer; and
a first conductive via penetrating the second photosensitive dielectric layer in the through hole to be connected to both of the first trace pattern and the first semiconductor chip.

* * * * *